(12) United States Patent
Hopsecger et al.

(10) Patent No.: US 9,030,188 B2
(45) Date of Patent: May 12, 2015

(54) WIDE RANGE, HIGH RESOLUTION FREQUENCY MONITOR

(75) Inventors: Edward Hopsecger, Mentor, OH (US); David R. Goodnetter, Lisbon, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 495 days.

(21) Appl. No.: 13/420,303

(22) Filed: Mar. 14, 2012

(65) Prior Publication Data

US 2013/0241531 A1 Sep. 19, 2013

(51) Int. Cl.
*G01R 23/02* (2006.01)
*G01R 23/10* (2006.01)

(52) U.S. Cl.
CPC .................................. *G01R 23/10* (2013.01)

(58) Field of Classification Search
CPC ........................................................ G01R 23/10
USPC ................. 324/76.39–76; 327/47, 48; 377/49
See application file for complete search history.

(56) References Cited

U.S. PATENT DOCUMENTS

| | | | |
|---|---|---|---|
| 3,663,885 A | | 5/1972 | Stewart |
| 5,262,714 A | | 11/1993 | Friedman |
| 6,298,393 B1 * | | 10/2001 | Hopsecger ........................ 710/8 |
| 7,133,791 B1 | | 11/2006 | Su |
| 2009/0014652 A1 * | | 1/2009 | Chammings et al. ......... 250/330 |
| 2009/0251129 A1 | | 10/2009 | Todorokihara et al. |
| 2010/0213353 A1 * | | 8/2010 | Dierickx ................... 250/214 R |
| 2011/0050352 A1 | | 3/2011 | Kondo et al. |
| 2011/0084687 A1 * | | 4/2011 | Todorokihara ............. 324/76.19 |

FOREIGN PATENT DOCUMENTS

| | | |
|---|---|---|
| CN | 102004063 A | 4/2011 |
| CN | 102033162 A | 4/2011 |
| EP | 0058282 A1 | 8/1982 |
| EP | 0484629 A2 | 5/1992 |

OTHER PUBLICATIONS

Horowitz, et al., The Art of Electronics, section 15.10 Frequency, period and time-interval measurements, pp. 1019-1024, section 1.14 Differentiators, pp. 25-26, section 9.38 Digital filters, pp. 664-667, 2nd edition, Cambridge University Press, 1989.*
Moving average, available at http://en.wikipedia.org/wiki/Moving_average on Sep. 19, 2011.*
Programmable logic controller, available at http://en.wikipedia.org/wiki/Programmable_logic_controller on Feb. 8, 2012.*
European Search Report; EP Application No. 2 639 590 A1; Publication Date Sep. 18, 2013.
SIPO Office Action for Chinese Application No: 201310081579.4; Filing Date: Mar. 14, 2013; along with the English translation.

* cited by examiner

*Primary Examiner* — Melissa Koval
*Assistant Examiner* — Daniel Miller
(74) *Attorney, Agent, or Firm* — Boyle Fredrickson, S.C.

(57) ABSTRACT

A frequency monitor provides high resolution frequency monitoring over a range of input signal frequencies by measuring the time period of the signal to produce a raw frequency value and then filtering the raw frequency value with a low pass filter to remove an error component caused by quantization effects at high input signal frequencies. The system automatically accommodates changes in the input frequency eliminating a need for manual adjustment of the system based on anticipated measured frequencies.

11 Claims, 3 Drawing Sheets

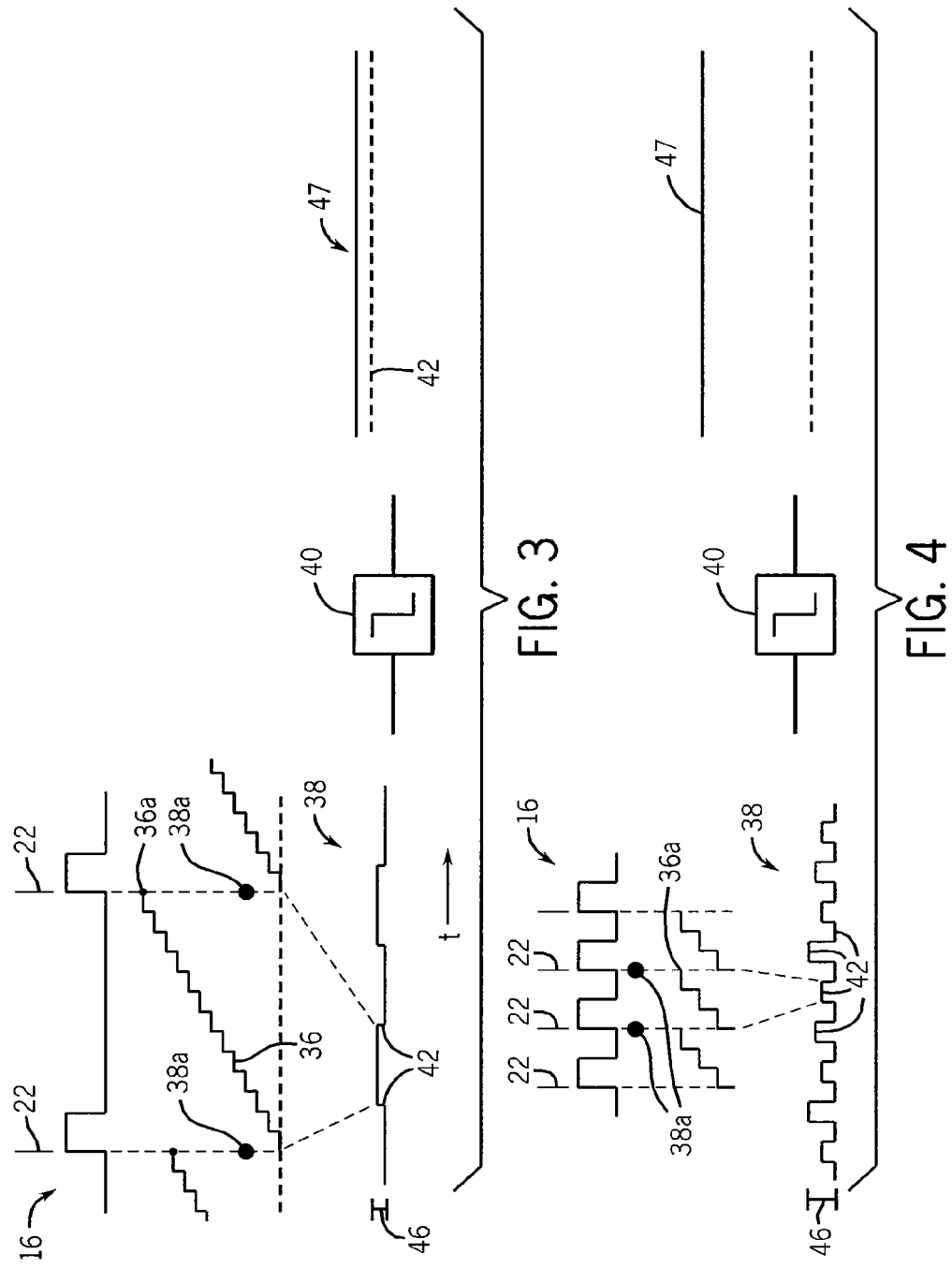

WIDE RANGE, HIGH RESOLUTION FREQUENCY MONITOR

FIELD OF THE INVENTION

This application generally relates to frequency monitors for measuring the frequency of a periodic signal and particularly to a frequency monitor that may automatically accommodate a wide range of input frequencies with high resolution.

BACKGROUND

Frequency monitors may be employed to measure periodic signals, for example, electrical pulses from a tachometer or the like. Low-frequency signals are typically measuring the time between signal "features" of two successive cycles of the signal, for example, the rising edge of a square-wave pulse or zero crossing of a sine wave. The measured time may be obtained by counting "ticks" of a high-speed clock between the occurrence of these signal features and this count may be inverted to obtain a measure of frequency.

As the frequency rises, the number of measured clock ticks falls decreasing the effective resolution of the measurement. This decrease in resolution may be avoided by increasing the resolution of the clock (for example, using a higher clock frequency) or by converting to a second measurement method of counting the number of signal features for a given unit of time, for example, the number of rising edges or zero crossings per second. This second method provides increased resolution as the frequency rises and more clock ticks are counted in that given unit of time. This approach yields a direct measurement of frequency without the need for inversion.

In order to accommodate a wide variety of frequencies to be measured, frequency monitors may have manual settings allowing the user to set the clock frequency (effectively the resolution of the measurement) or to select between these two above-described methods of frequency measurement: (1) timing the duration between pulses or (2) counting a number of pulses for a given time duration.

This need to manually set the frequency monitor or to determine the likely frequency of the input signal can be problematic in an automatic control environment where knowledge about the frequency of the input signal may not be well known and there is a desire to avoid the need for human intervention.

SUMMARY OF THE INVENTION

The present invention provides a monitoring system that employs the first method described above, of timing an interval between successive signal features, and then applying a time domain filter to a period or frequency value derived from that interval. As the frequency of the signal to be measured rises, loss in resolution is manifest as a high frequency error component to the measurement and this error component is removed by the filter. The effectiveness of the filter in removing the error component increases as the frequency of the signal to be measured increases, providing a higher sampling rate that is increasingly filtered, in effect, compensating for the decreased resolution that would normally be associated with higher frequencies.

Specifically then, the present invention, in one embodiment, provides a frequency monitor having an input for receiving a signal to be measured and a signal feature extractor identifying a regular feature of the signal related to the signal's period. A timer system communicates with the signal feature extractor to provide an output being a function of period of the signal, and a low pass filter receives the output to reduce high frequency fluctuations in the output value to provide a measurement output for monitoring frequency of the signal.

It is thus a feature of at least one embodiment of the invention to provide a frequency-measuring device that may automatically accommodate a wide range of input signal frequencies without the need for manual or semiautomatic adjustment. The filter smoothly compensates for quantization error that would otherwise decrease the resolution of frequency measurement using the period monitoring technique for high frequency input signals.

The signal may be a square wave and the feature extractor may be an edge detector.

It is thus a feature of at least one embodiment of the invention to provide a system working with common square wave inputs using a robust feature extractor.

The timer system may include a timer measuring the period of the signal and an inverter converting the period to frequency.

It is thus a feature of at least one embodiment of the invention to apply the filter directly to a frequency signal for more intuitive filtered output when frequency is desired. More generally, the filtering can occur before the inversion process to act directly on the deduced signal period.

The timer may be a clock providing a periodic clock signal communicating with a counter counting the periodic clock signal between detection signals from the signal feature extractor identifying a regular feature of the signal. The output of the timer may be a digital word and the low pass filter is a digital low pass filter.

It is thus a feature of at least one embodiment of the invention to provide a digital domain system that may be readily implemented with digital logic.

Alternatively the output of the timer may be an analog voltage and a low pass filter is an analog low pass filter.

It is thus a feature of at least one embodiment of the invention to provide a versatile system that may be implemented in analog or a combination of analog and digital circuitry.

The frequency monitor may further include input to the low pass filter adjusting a corner frequency of the low pass filter.

It is thus a feature of at least one embodiment of the invention to permit adjustment by the user based on anticipated rates of change of frequency to effect a flexible trade-off between resolution and measurement response. It is a further feature of some embodiments of the invention to providing a filtering of noise that may cause loss of pulses in the primary signal.

Numerous other features, objects and advantages of the present invention will be made apparent from the following detailed description taken together with the drawing figures.

BRIEF DESCRIPTION OF THE DRAWINGS

FIG. 3 is a graph of an input signal to the feature extractor aligned with a graph of the resulting output of the clock and the inverter for an input signal having a relatively low frequency relative to an internal clock;

FIG. 4 is a figure similar to that of FIG. 3 for an input signal having a relatively high frequency relative to the internal clock.

DETAILED DESCRIPTION OF THE INVENTION

Figure 1:
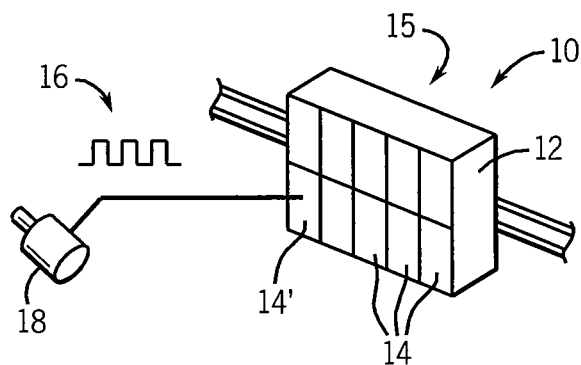
FIG. 1 is a simplified perspective view of an industrial control, point I/O unit providing a housing that may hold multiple input/output modules for communication between an industrial process and an industrial control system, one input/output module providing frequency monitoring according to the present invention, shown as monitoring a frequency of a tachometer.

Referring now to FIG. 1, an industrial control I/O unit 10 may provide for a housing 12 holding multiple modules 14 including those supporting terminal blocks, input and output circuits, power supplies, and network communication devices. Each of these modules 14 may communicate on a common backplane 15 distributing power to the modules 14 and providing a communication path for data between the modules 14 and between the I/O unit 10 and a remote industrial control system (not shown) via a network communication device.

A frequency monitoring module 14' may receive an input signal 16, for example a square wave or other periodic signal from sensors on controlled equipment, for example a tachometer, 18 which provides signal 16 whose frequency changes in proportion to a rotational rate of the tachometer 18 when attached to a rotating machine or the like. Other signal sources include, for example, optical switches and the like.

Figure 2:
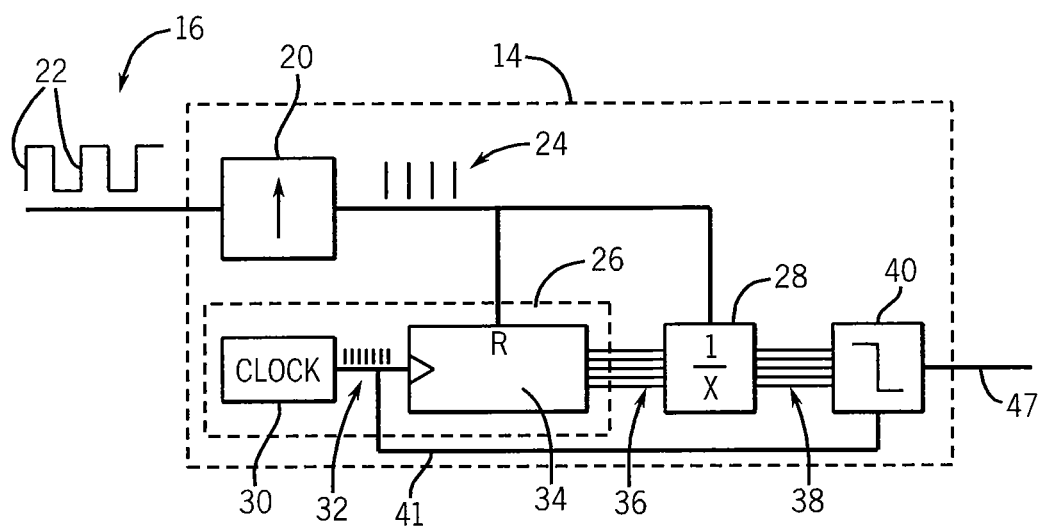
FIG. 2 is a block diagram of the functional components of the frequency-monitoring module of FIG. 1 showing a feature extractor, a timer, an inverter, and a low pass filter.

Referring now to FIG. 2, the input signal 16 may be received by a feature extractor 20 in the module 14' that may extract a regular feature from the input signal 16 related to the period of the input signal 16. In the case of a square wave input signal 16, the feature extractor is preferably a rising edge detector detecting a rising edge 22 of the square wave of the input signals 16. It will be appreciated that other feature extraction systems may be provided, for example those detecting zero crossing of the signal 16 or particular levels of voltage or current of the signal 16 that can be used for other signal types including sine waves. The feature extractor 20 may include preprocessing circuitry of a type known in the art including buffer amplifiers for amplifying the input signal 16, automatic gain control circuits for adjusting the amplitude of the input signal 16, filters for removing noise from the input signal 16, and the like.

An output of the feature extractor 20 may be a series of pulses 24 coincident with the detective feature and that pass to a timer 26 and to an inverter 28. The timer 26 may comprise a clock signal generator 30 producing a regular train of pulses 32 at a predefined and substantially constant frequency that are applied to the clock input of a standard digital counter 34 counting those pulses 32.

The pulses 24 of the feature extractor 20 may be applied to the reset input of the counter 34 so that it starts counting from zero at the occurrence of each extracted feature. The pulses 24 may also go to the inverter which may serve to capture and invert the output 36 of the counter 34 immediately before it is reset. Thus, the time between the features extracted by the feature extractor 20 (and hence the time period of the input signal 16) may be captured and received by the inverter 28. Generally, the output of the counter 34, in this embodiment, will be a digital word expressed by binary bits each represented by a voltage level.

Inverter 28 performs an arithmetical inversion (as opposed to a Boolean inversion) on the output 36 to provide a measured frequency output 38 which may also be a digital word. Inverter 28 thus converts period to frequency according to a well-understood formula.

The output of the inverter 28 representing frequency is provided to a low pass filter 40 which performs a time domain low pass filtering of the measured frequency output 38. The measured frequency output 38 will be sampled by the low pass filter 40 at the same rate as the clock 30 as synchronized by clock line 41. As will be understood to those of ordinary skill in the art, low pass filtering preferentially passes low frequency components of a signal and thus will tend to pass slow changes of the measured frequency output 38 and suppress rapid changes of the measured frequency output 38. The low pass filter 40 may be, for example, a four-pole, infinite impulse response filter.

Referring now to FIG. 3, when the frequency of the input signal 16 is relatively slow (e.g. relative to the pulses 32) the output 36 of the counter 34 will accumulate to a relatively high value output 36a before the counter 34 is reset. This will correspond to a reduced value of the measured frequency output 38a. Further, the calculation of frequency (for example indicated by a measured frequency output 38a) will occur at a relatively low rate to provide a set of frequency samples 42 describing change in a measured frequency output 38 of the signal 16. This slowly changing measured frequency output 38 when received by the low pass filter 40 will pass generally unaffected to produce a corrected frequency output 47 providing high resolution measurement of the frequency of the input signal 16. Generally any error 46 in the measured frequency will be very low and is exaggerated in FIG. 3 for illustrative purposes.

Referring now to FIG. 4, in contrast to the situation depicted in FIG. 3, relatively high frequency of input signal 16 will produce relatively low maximum count output 36a and correspondingly higher measured frequency output 38a. The short counting time of the counter 34 will result in higher frequency of samples 42 and also the imposition of an error level 46 jitter caused by the high quantization error of the counting process in proportion to the total count when the count is truncated at a low value. The error level 46 will be higher in amplitude and at a higher frequency than the error level 46 of FIG. 3. This can be understood intuitively, for example, by considering when the clock frequency of the clock signal generator 30 represented by pulses 32 is close to the frequency of the input signal 16 and the count value will fluctuate between zero and one representing an error level 46 of 100 percent. This error level 46, however, will be at a high frequency because of the relatively frequent resetting of the counter 34 such as produces a sample 42, and thus this error level 46 will be removed by the low pass filter 40 to produce a smooth corrected frequency output 47 with a substantially reduced error level 46 and thus having implicitly a higher resolution.

Importantly, the action of the filter 40 is substantially automatic without the need to anticipate the frequency of the input signal 16 or to make adjustments in the measuring technique.

Figure 5:
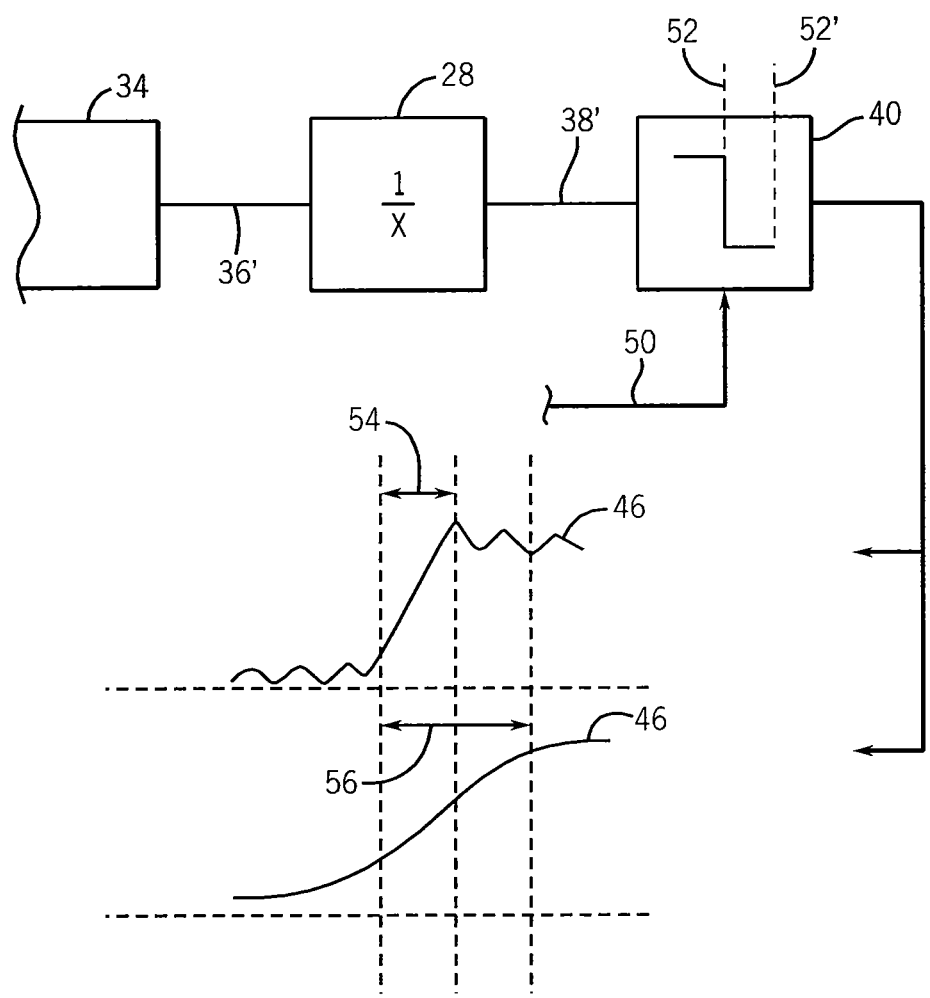
FIG. 5 is a fragmentary view of the block diagram of FIG. 2 showing adjustment of the filter corner frequency and its effect on output responsiveness.

Referring now to FIG. 5, the corner frequency of the low pass filter 40 will generally be set many decades below the frequency of the pulses 32 depending on the responsiveness desired from the frequency monitoring module 14' (for example, there may be as many as four decades between the corner frequency and the frequency of the clock 30). In addition, a user input 50 may be provided to the filter 40 to adjust the corner frequency 52 of the filter between corner frequency 52 and corner frequency 52'. Alternatively, digital filter constants may be adjusted while leaving the filter sample rate 50 the same. This adjustment can affect the filter output dither, but will primarily affect the speed at which the corrected frequency output 47 may change and is an important consideration when the frequency of the input signal 16 is expected to change rapidly. Generally a higher corner frequency 52' will provide a reduced adjustment time 54 in the corrected frequency output 47 when there is a step increase (or decrease) in the frequency of the measured signal 16. In contrast, a lower corner frequency 52 will provide a lengthened adjustment time 56 in the corrected frequency output 47 when there is a step increase (or decrease) in the frequency of the measured signal 16.

Referring still to FIG. 5, it will be appreciated that the counter 34 and inverter 28 may be implemented by analog circuitry (for example, using an integrator and a logarithmic inverter) or the hybrid arrangement using digital and analog components and/or can produce analog counter output 36' and analog measured frequency output 38' permitting the filter 40 to be implemented using various analog rather than digital techniques. For example, the counter output 36 or inverted output 38 could be fed to a DAC and subsequently provided to an analog filter.

Various other embodiments of the invention are contemplated as being within the scope of the following claims particularly pointing out and distinctly claiming the subject matter regarded as the invention.

What is claimed is:

1. A frequency monitor comprising:
    an input for receiving a signal to be measured;
    a signal feature extractor identifying a regular feature of the signal related to the signal's period;
    a timer system including a clock providing a periodic clock signal communicating with a counter counting the periodic clock signal between detection signals from the signal feature extractor identifying a regular feature of the signal, the timer system communicating with the signal feature extractor to provide an output being a function of the period of the signal;
    an inverter receiving the output and converting the period of the signal to a frequency to provide a measured frequency output;
    a low pass filter receiving the measured frequency output to reduce high frequency fluctuations in the measured frequency output to provide a corrected frequency output for monitoring frequency of the signal, wherein the low pass filter is in communication with the clock to sample the measured frequency output at the same rate as the clock, and wherein the low pass filter includes an input for adjusting a corner frequency of the low pass filter.

2. The frequency monitor of claim 1 wherein the signal is a square wave and the feature extractor is an edge detector.

3. The frequency monitor of claim 1 wherein the output of the clock is a digital word and the low pass filter is a digital low pass filter.

4. The frequency monitor of claim 1 wherein the output of the clock is an analog voltage and the low pass filter is an analog low pass filter.

5. The frequency monitor of claim 1 wherein the low pass filter is a four-pole infinite impulse response filter.

6. A method of monitoring frequency comprising the steps of:
    (a) receiving at an input of an electrical circuit an electrical signal to be measured;
    (b) extracting from the electrical signal, by a signal feature extractor circuit of the electrical circuit, regular features of the signal related to the signal's period;
    (c) measuring the period of the electrical signal, by a timer system communicating with the signal feature extractor circuit and including a clock providing a periodic clock signal communicating with a counter counting the periodic clock signal between detection signals from the signal feature extractor circuit extracting regular features of the signal, as demarcated by the regular features and outputting an output being a function of the period of the signal;
    (d) inverting the output and converting the period of the signal to a frequency to provide a measured frequency output;
    (e) filtering the measured frequency output with a low pass filter to reduce high frequency fluctuations in the measured frequency output to provide a corrected frequency output representing a frequency of the signal, wherein the low pass filter communicates with the clock to sample the measured frequency output at the same rate as the clock; and
    (f) adjusting a corner frequency of the low pass filter.

7. The method of claim 6 wherein the signal is a square wave and the regular feature is an edge of the square wave.

8. The method of claim 6 wherein the output of the counter is a digital word and the filtering is done with a digital low pass filter.

9. The method of claim 6 wherein the output of the counter is an analog voltage and the filtering is done with an analog low pass filter.

10. The method of claim 6 wherein the low pass filter is a four-pole infinite impulse response filter.

11. An input module for an industrial control system providing a housing with a backplane providing power to and data communication between multiple modules fitting within the housing; the input module comprising:
    an input for receiving a signal to be measured;
    a signal feature extractor circuit identifying a regular feature of the signal related to the signal's period;
    a timer system including a clock providing a periodic clock signal communicating with a counter counting the periodic clock signal between detection signals from the signal feature extractor identifying a regular feature of the signal, the timer system circuit communicating with the signal feature extractor to provide an output being a function of the period of the signal;
    an inverter receiving the output and converting the period of the signal to a frequency to provide a measured frequency output;
    a low pass filter circuit receiving the measured frequency output to reduce high frequency fluctuations in the measured frequency output to provide a corrected frequency output for monitoring frequency of the signal, wherein the low pass filter is in communication with the clock to sample the measured frequency output at the same rate as the clock, and wherein the low pass filter includes an input for adjusting a corner frequency of the low pass filter; and
    an output terminal communicating with the backplane of the housing of the industrial controller for transmitting the measured frequency output thereon.

* * * * *

UNITED STATES PATENT AND TRADEMARK OFFICE
CERTIFICATE OF CORRECTION

| | | |
|---|---|---|
| PATENT NO. | : 9,030,188 B2 | Page 1 of 1 |
| APPLICATION NO. | : 13/420303 | |
| DATED | : May 12, 2015 | |
| INVENTOR(S) | : Edward Hopsecger et al. | |

It is certified that error appears in the above-identified patent and that said Letters Patent is hereby corrected as shown below:

IN THE CLAIMS

CLAIM 11, Col. 6, Line 61,

Delete "the measured frequency output thereon," and substitute therefor

-- the corrected frequency output thereon --

Signed and Sealed this
Tenth Day of November, 2015

Michelle K. Lee
*Director of the United States Patent and Trademark Office*